United States Patent [19]
Tseng

[11] Patent Number: 5,670,401
[45] Date of Patent: Sep. 23, 1997

[54] METHOD FOR FABRICATING A DEEP SUBMICRON MOSFET DEVICE USING AN IN-SITU POLYMER SPACER TO DECREASE DEVICE CHANNEL LENGTH

[75] Inventor: Horng-Huei Tseng, Hsinchu, Taiwan

[73] Assignee: Vanguard International Semiconductor Corporation, Hsin-Chu, Taiwan

[21] Appl. No.: 703,917

[22] Filed: Aug. 22, 1996

[51] Int. Cl.$^6$ .................................. H01L 21/8234
[52] U.S. Cl. .................. 437/44; 437/29; 437/41 SW; 437/229
[58] Field of Search ............... 437/44, 41 RLD, 437/41 SW, 40 SW, 29, 40 R, 41 R, 203, 913, 40 GS, 41 GS, 229

[56] References Cited

U.S. PATENT DOCUMENTS

| | | | |
|---|---|---|---|
| 5,084,419 | 1/1992 | Sakao | 437/228 |
| 5,244,835 | 9/1993 | Hachiya | 437/186 |
| 5,266,508 | 11/1993 | Azuma et al. | 437/41 RLD |
| 5,429,956 | 7/1995 | Shell et al. | 437/29 |
| 5,434,093 | 7/1995 | Chau et al. | 437/44 |
| 5,489,543 | 2/1996 | Hong | 437/41 |
| 5,534,447 | 7/1996 | Hong | 437/44 |
| 5,538,913 | 7/1996 | Hong | 437/44 |
| 5,573,962 | 11/1996 | Sung | 437/29 |
| 5,614,430 | 3/1997 | Liang et al. | 437/44 |

FOREIGN PATENT DOCUMENTS 5-235294  9/1993  Japan.

*Primary Examiner*—Michael Trinh
*Attorney, Agent, or Firm*—George O. Saile

[57] ABSTRACT

A process for fabricating a deep submicron MOSFET device has been developed, featuring a local threshold voltage adjust region in a semiconductor substrate, with the threshold voltage adjust region self aligned to an overlying polysilicon gate structure. The process consists of forming a narrow hole opening in a dielectric layer, followed by an ion implantation procedure used to place the threshold voltage adjust region in the specific area of the semiconductor substrate, underlying the narrow hole opening. A polysilicon deposition, followed by a chemical mechanical polishing procedure, results in the creation of a narrow polysilicon gate structure, in the narrow hole opening, self aligned to the threshold voltage adjust region.

20 Claims, 5 Drawing Sheets

METHOD FOR FABRICATING A DEEP SUBMICRON MOSFET DEVICE USING AN IN-SITU POLYMER SPACER TO DECREASE DEVICE CHANNEL LENGTH

BACKGROUND OF THE INVENTION

(1) FIELD OF THE INVENTION

The present invention relates to a process in which metal oxide semiconductor field effect transistor, (MOSFET), devices are fabricated, and more specifically to a process used to fabricate very narrow channel length, MOSFET devices.

(2) DESCRIPTION OF PRIOR ART

The semiconductor industry is continually striving to improve the performance of MOSFET devices while still maintaining, or even decreasing the cost of semiconductor chips comprised of MOSFET devices. These objectives have been in part realized via the trend to micro-miniaturization or the ability to create submicron features in semiconductor chips. The ability to achieve micro-miniaturization has been realized via advances in specific semiconductor fabrication disciplines, mainly photolithograhy and anisotropic dry etching. For example the use of more sophisticated exposure cameras, as well as the development of more sensitive photoresist materials, has resulted in the routine attainment of submicron images in photoresist layers. In turn the development of reactive ion etching, (RIE), tools and processes, has allowed the submicron images in photoresist layers to be easily transferred to underlying materials used in the fabrication of semiconductor devices. However to continue to improve the performance of MOSFET devices, specifically areas of the MOSFET device have to be properly engineered to optimize performance.

Deep submicron MOSFET devices, that is MOSFET devices with channel lengths less then 0.35 uM, are being fabricated in an effort to improve device performance. The smaller features of the deep submicron MOSFET device results in a decrease in the performance degrading, parasitic capacitances, obtained with larger dimension counterparts. However there are specific areas of the deep submicron MOSFET device, resulting in higher then desired parasitic capacitance, that still have to be addressed. For example the threshold voltage adjust region, created in the channel region of the MOSFET device, results in a significant level of junction capacitance. This invention will teach a process for restricting the threshold voltage adjust region to a local area of the channel region, thus reducing unwanted junction capacitances encountered with a less local threshold voltage adjust region. The local threshold adjust region, for deep submicron MOSFET devices, is achieved via a unique processing procedure, featuring a polysilicon refill process and chemical mechanical polishing, (CMP), step, used to create a narrow polysilicon gate structure overlying a local threshold adjust region. Prior art such as Hong, et al., in U.S. Pat No. 5,489,543, uses a threshold voltage adjust region formed via ion implantation through a polysilicon layer, and a gate insulator layer, into the underlying semiconductor substrate. This invention will describe a polysilicon gate structure formed after creation of a local threshold voltage region, self-aligned to the local threshold voltage adjust region via use of an opening in a dielectric layer, used for both the threshold voltage adjust, and the polysilicon gate structure definition. In addition this invention will teach an insitu polymer deposition, performed on the sides of a photoresist image, used to define the gate area. The polymer layer on the sides of the photoresist image results in a decrease in subsequent channel length, with the reduction being proportional to the thickness of the deposited polymer.

SUMMARY OF THE INVENTION

It is an object of this invention to fabricate deep submicron MOSFET devices using local threshold voltage adjust regions.

It is another object of this invention to create a local threshold voltage adjust region, in a semiconductor substrate, via an ion implantation of dopants through a gate insulator layer, and into a local region of a semiconductor substrate, using a narrow opening, in a dielectric layer, as a mask.

It is yet another object of this invention to form polymer spacers, on the sides of a hole in a photoresist layer that is used as a mask, to define a gate region in a dielectric layer. The smaller hole in the photoresist layer, allows a smaller hole to be defined in the underlying dielectric layer, thus ultimately decreasing the channel length of a subsequent MOSFET device.

It is still another object of this invention to create the polysilicon gate structure for the deep submicron MOSFET device by completely filling the narrow opening in a dielectric layer with polysilicon, followed by a chemical mechanical polishing procedure, used to remove unwanted polysilicon from the outside narrow opening in the dielectric layer.

In accordance with the present invention a process for fabricating deep submicron MOSFET devices is described. A thick dielectric layer is deposited on a semiconductor substrate. Photolithographic procedures are used to create a narrow opening in a photoresist layer, followed by the formation of polymer spacers on the sides of the narrow opening in the photoresist layer. A narrow opening in the dielectric layer is then defined, in the same tool used to create the polymer spacers, with the narrow opening in the dielectric layer smaller then the original opening in the photoresist layer, by an amount proportional to the thickness of the polymer spacers. After removal of the photoresist layer and the polymer spacer, an ion implantation procedure is performed, into the semiconductor substrate, through the narrow opening in the dielectric region, creating a local threshold adjust region. A gate insulator layer is thermally grown on the semiconductor substrate, exposed in the narrow opening in the dielectric layer. A polysilicon deposition is next performed, completely filling the narrow opening in the dielectric layer, followed by chemical mechanical polishing procedures, used to remove polysilicon from the top surface of the dielectric layer. The dielectric layer is next removed resulting in a narrow polysilicon gate structure, on a gate insulator layer, directly overlying a local threshold adjust region. Lightly doped source and drain regions are next formed, followed by the deposition of another insulator layer, and anisotropic RIE procedures, used to create an insulator spacer on the sides of the narrow polysilicon gate structure. Heavily doped source and drain regions are next formed followed by contact metallization procedures.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

Figure 1:
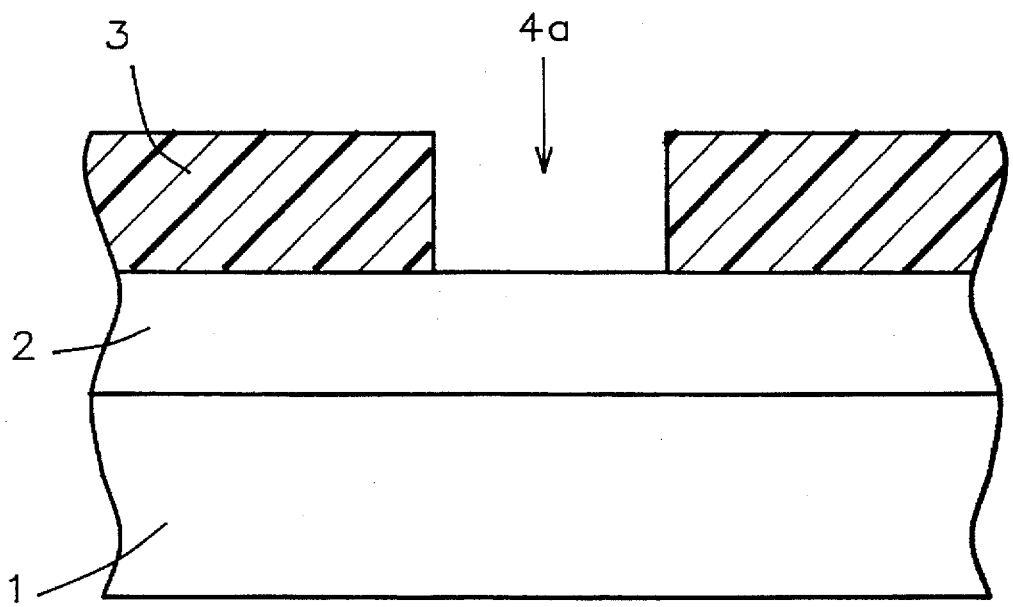
FIG. 1–3, which schematically, in cross-sectional style, show the significant stages of processing used to create the narrow hole in a dielectric layer, using the polymer spacer process.

The method for creating a deep submicron MOSFET device will now be covered in detail. Deep submicron is referred to as a dimension of less than 0.35 uM in width, and a deep submicron MOSFET device is referred to a MOSFET device with a submicron channel length of less than 0.35 uM. A P type, single crystalline silicon substrate, 1, with a <100> crystallographic orientation, shown in FIG. 1, is used. Field oxide regions, (not shown in the drawings), comprised of between about 3000 to 6000 Angstroms of thermally grown silicon dioxide, are formed for purposes of isolation. After a careful wet clean, and a dilute hydrofluoric acid treatment, a thick dielectric layer, 2, of silicon oxide is next deposited using low pressure chemical vapor deposition, (LPCVD), procedures, at a temperature between about 700° to 750° C., to a thickness between about 2000 to 5000 Angstroms. A photoresist pattern, 3, featuring a narrow opening, 4a, between about 0.20 to 0.50 uM, in width, is next created on the surface of dielectric layer, 2. This is shown schematically in FIG. 1.

Figure 2:
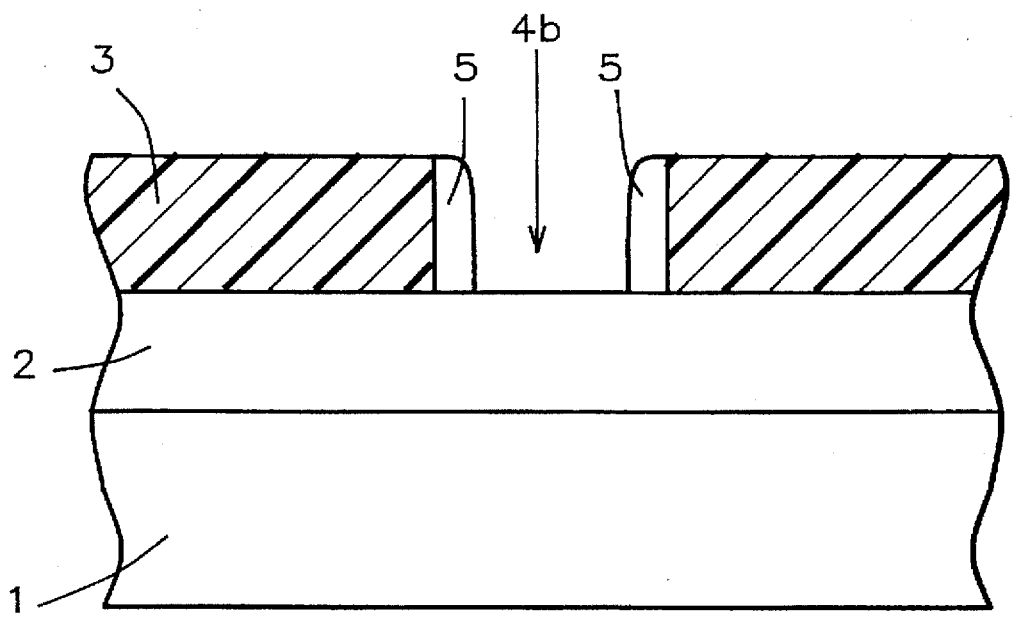
Figure 3:
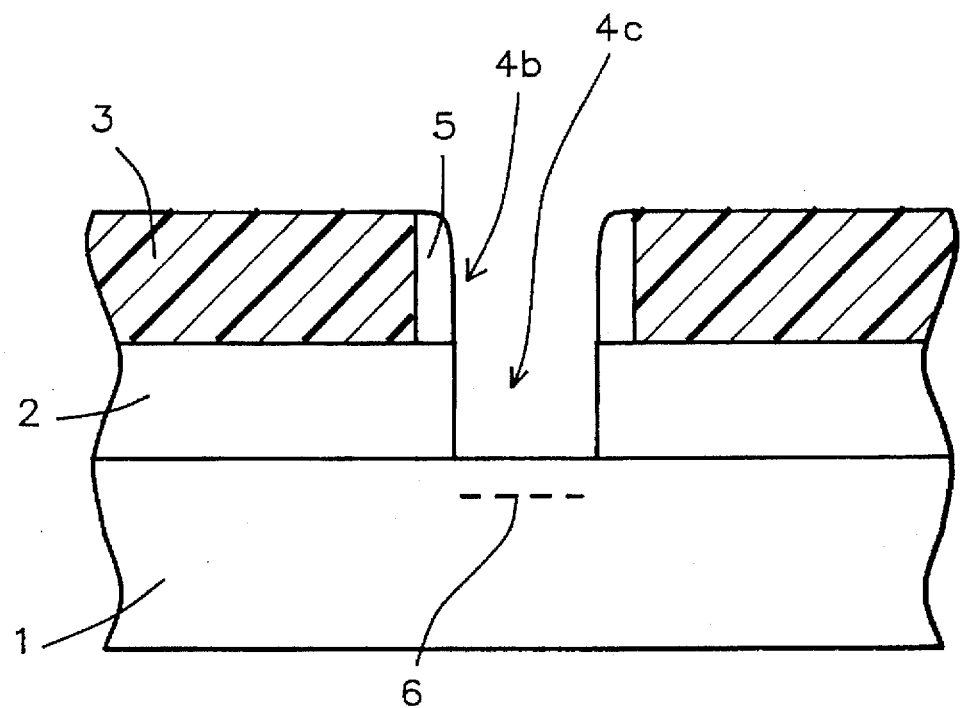

Narrow opening, 4a, limited by photolithographic conditions, can be further narrowed via the creation of polymer spacers, 5, shown schematically in FIG. 2. Via use of the same dry etching chamber, to be used for subsequent patterning of dielectric layer, 2, a polymer layer is deposited on the sides of narrow opening, 4a, in photoresist layer, 3. The non-volatile, polymer spacers, 5, are formed in an ambient of $CF_4$ and $CHF_3$, prior to initiating the etching of dielectric layer, 2. The thickness of polymer spacer, 5, is between about 0.10 to 0.20 uM, resulting in a significant reduction in the width of narrow opening, 4a, to a polymer coated opening, 4b, between about 0.10 to 0.30 uM. This is shown schematically in FIG. 2. The etching chemistry in the chamber is then changed allowing the polymer coated opening, in photoresist layer, 3, to be transferred to underlying dielectric layer, 2, using $CHF_3$ as an etchant. The resulting dielectric opening, 4c, shown schematically in FIG. 3, has the identical dimensions of polymer coated opening, 4b. Removal of photoresist layer, 3, as well as removal of polymer spacers, 5, are accomplished via plasma oxygen ashing, followed by careful wet cleans.

Figure 4:
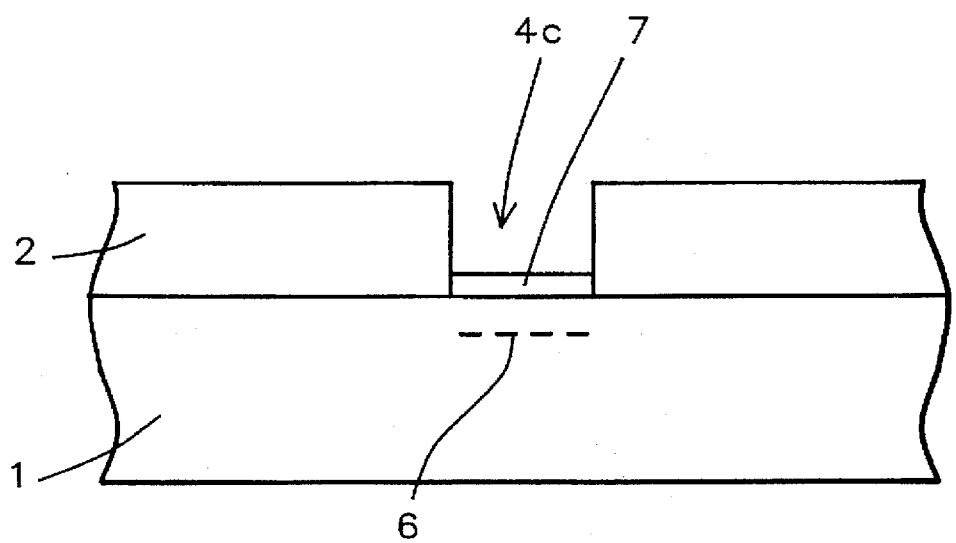
FIGS. 4–9, which schematically, in cross-sectional style show the creation of a deep sub micron MOSFET device, using a local threshold voltage adjust region, self-aligned to an overlying polysilicon gate structure.

A critical stage of this invention, the creation of a narrow, local threshold voltage adjust region, 6, is next addressed. An ion implantation of boron, at an energy between about 10 to 30 KeV, at a dose between about 1E11 to 1E13 atoms/$cm^2$, is used to place threshold voltage adjust region, 6, in semiconductor substrate, 1. This region is self-aligned to the dielectric opening, 4c, thus this narrow, local region of higher doping will subsequently allow less junction capacitance to result then counterparts fabricated with wider threshold voltage adjust regions. This is shown schematically in FIG. 4. A gate insulator, 7, is thermally grown in an oxygen-steam ambient, at a temperature between about 850° to 1000° C., to create a silicon oxide, gate insulator layer, 7, at a thickness between about 50 to 200 Angstroms. This is also shown schematically in FIG. 4.

Figure 5:
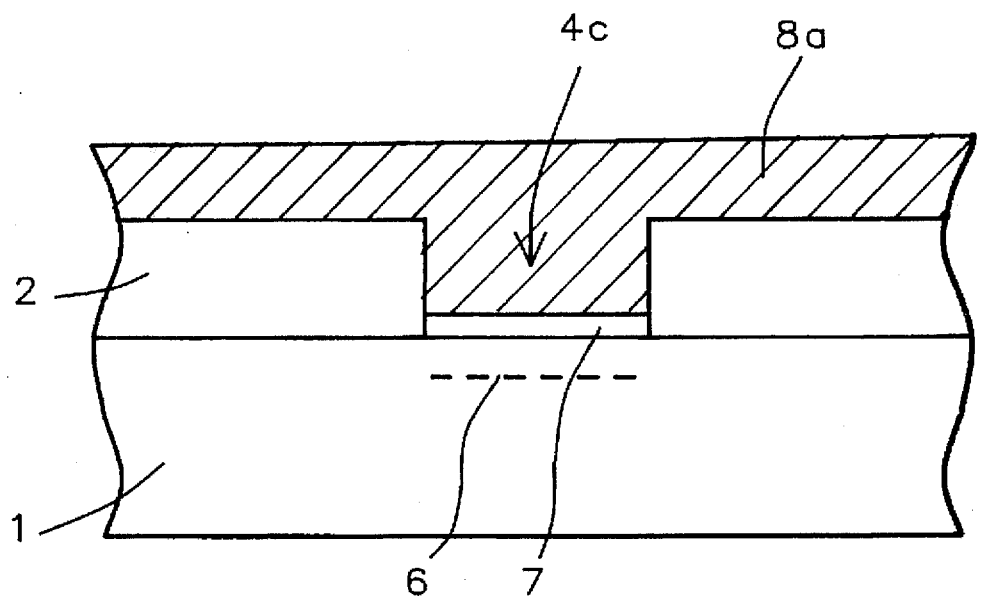
Figure 6:
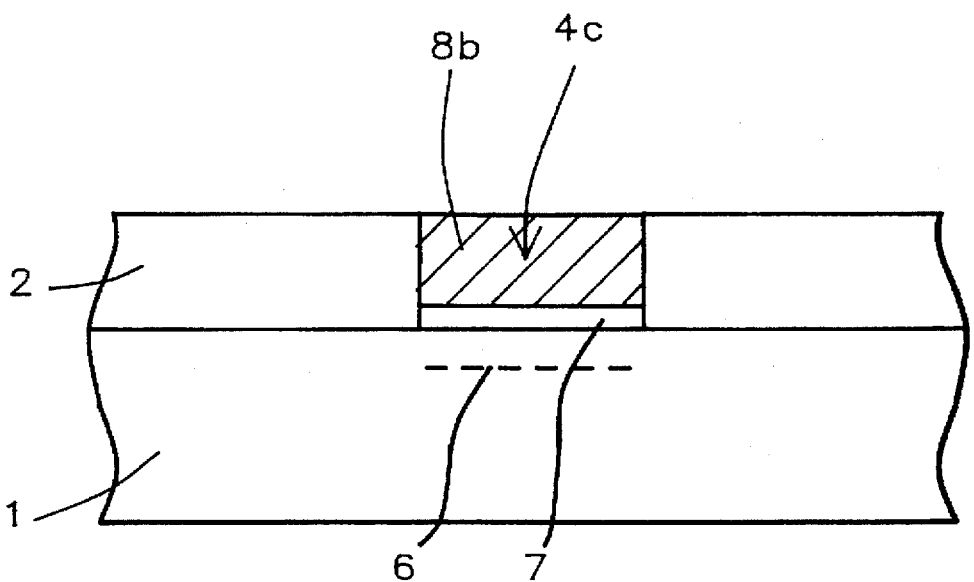

A polysilicon layer, 8a, shown schematically in FIG. 5, is next deposited using LPCVD procedures, at a temperature between about 525° to 575° C., to a thickness between about 1000 to 2000 Angstroms. Polysilicon layer, 8a, completely fills dielectric opening, 4c. Polysilicon layer, 8a, can be deposited intrinsically and doped via ion implantation of phosphorous or arsenic, at an energy between about 25 to 75 KeV, at a dose between about 1E14 to 1E16 atoms/$cm^2$, or polysilicon layer, 7a, can be grown using insitu doping procedures via the incorporation of either phosphine or arsine to the silane ambient. A chemical mechanical polishing procedure, or dry etching procedure, using $Cl_2$ as an etchant, are then used to selectively remove polysilicon layer, 8a, from the top surface of dielectric layer, 2, creating a narrow polysilicon gate structure, 8b, schematically shown in FIG. 6. The narrow polysilicon gate structure, 8b, between about 0.10 to 0.30 uM, in width, is self-aligned to threshold voltage adjust region, 6. The planarization process, using either chemical mechanical polishing or dry etching is continued in insure complete removal of polysilicon layer, 8a, from areas where possible poor uniformity existed. This post planarization procedure removes between about 300 to 600 Angstroms of dielectric layer, 2.

Figure 7:
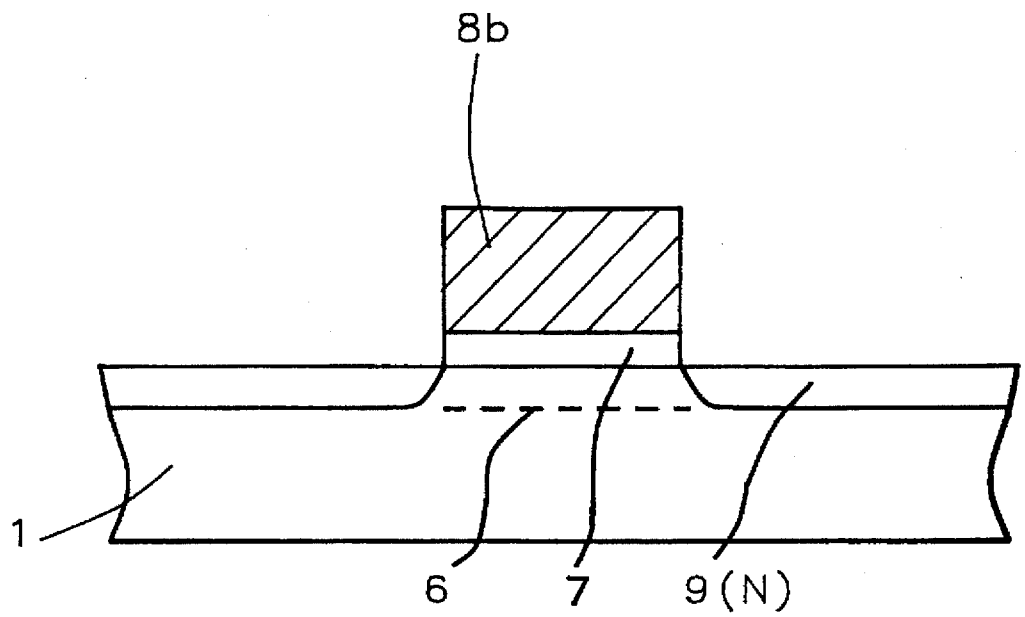

Dielectric layer, 2, is next removed using a buffered hydrofluoric acid solution as an etchant. Polysilicon gate structure, 8b, now allows a lightly doped source and drain region, 9, to be created, via an ion implantation of phosphorous, at an energy between about 20 to 40 KeV, at a dose between about 1E13 to 1E14 atoms/$cm^2$. The lightly doped source and drain region, 9, self-aligned to the threshold voltage adjust region, 6, is also schematically shown in FIG. 7.

Figure 8:
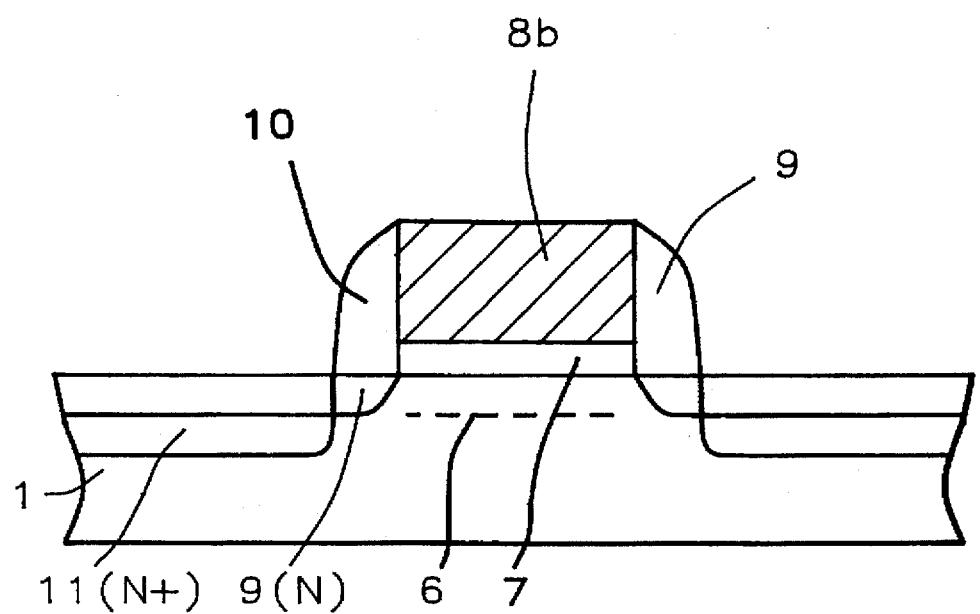

An insulator layer of silicon oxide, is next deposited using LPCVD or plasma enhanced chemical vapor deposition, (PECVD), procedures, at a temperature between about 700° to 750° C., to a thickness between about 1000 to 2500 Angstroms, using tetraethylorthosilicate, (TEOS), as a source. An anisotropic, RIE procedure, using $CHF_3$ as an etchant, is used to create insulator spacer, 10, schematically shown in FIG. 8. Also shown in FIG. 8, is the creation of a heavily doped source and drain region, 11, formed via ion implantation of arsenic at an energy between about 30 to 100 KeV, at a dose between about 1E15 to 3E16 atoms/$cm^2$.

Figure 9:
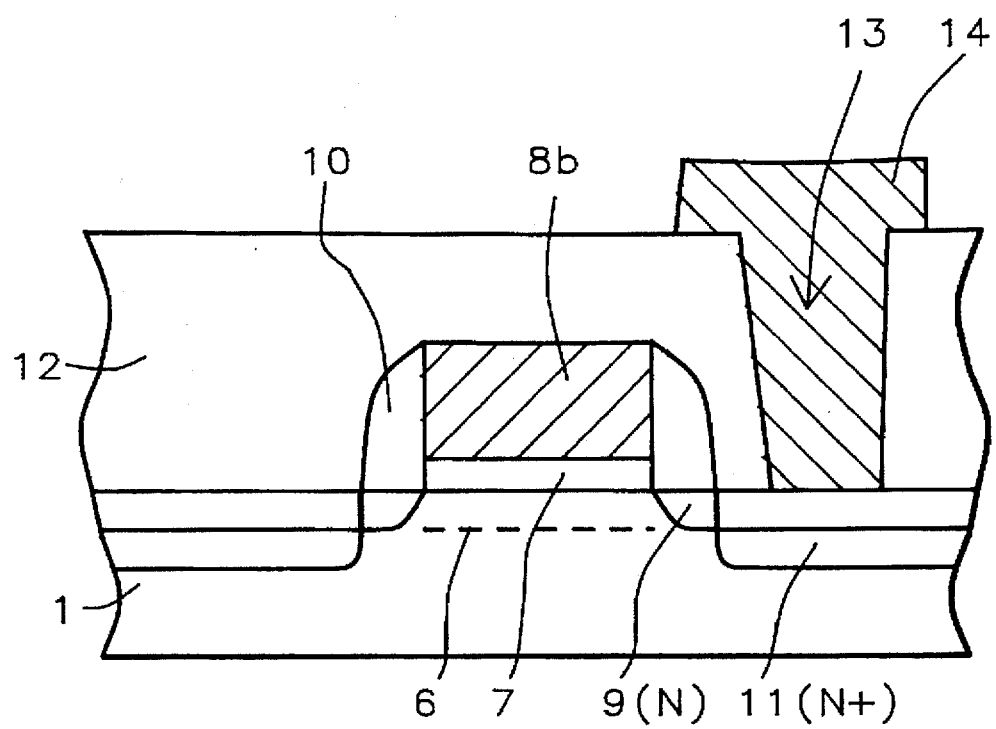

FIG. 9, schematically describes the processes used to create the metal contacts to the deep submicron MOSFET device. A silicon oxide layer, 12, is deposited using PECVD procedures, at a temperature between about 300° to 400° C., to a thickness between about 3000 to 8000 Angstroms. Conventional photolithographic and RIE procedures, using $CHF_3$ as an etchant, are used to create contact hole, 13, to heavily doped source and drain region, 11. An opening to polysilicon gate structure, 8b, is also created in silicon oxide layer, 12, however not shown in FIG. 9. The photoresist pattern is then removed using plasma oxygen ashing and careful wet cleans. A metallization layer comprised of aluminum, containing between about 1 to 3% copper, and between about 0.5 to 2% silicon, is deposited using r.f. sputtering procedures, to a thickness between about 3000 to 8000 Angstroms. Conventional photolithographic and RIE procedures, using $Cl_2$ as etchant, are used to create metal contact structure, 14, shown schematically in FIG. 9. Photoresist removal is once again accomplished using plasma oxygen ashing and careful wet cleans.

This process for creating a deep submicron MOSFET device, using a local threshold voltage adjust region, although shown for the creation of an N channel, of NFET device can easily be used to create a P channel, or PFET device. This process can also be used to fabricate complimentary, (CMOS), or bipolar, (BiCMOS), devices.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a MOSFET device, on a semiconductor substrate, with a local threshold voltage adjust region, comprising the steps of:

depositing a first dielectric layer on said semiconductor substrate;

forming a photoresist pattern, in a photoresist layer, on said first dielectric layer, with a narrow opening in said photoresist layer, exposing top surface of said first dielectric layer;

forming polymer spacers on the sides of said narrow opening in said photoresist layer, creating a polymer coated opening, in said photoresist layer;

forming a narrow hole opening in said first dielectric layer by etching of said first dielectric layer, using said photoresist pattern, with said polymer coated opening, as a mask;

removal of said photoresist pattern, and of said polymer spacers;

ion implanting a first conductivity imparting dopant, into an area of said semiconductor substrate, exposed in said narrow hole opening in said first dielectric layer, to create said local threshold adjust region;

growing a gate insulator layer on said semiconductor substrate, exposed in said narrow hole opening in said first dielectric layer;

depositing a polysilicon layer, completely filling said narrow hole opening in said first dielectric layer;

planarization of said polysilicon layer, by removal of said polysilicon layer from top surface of said first dielectric layer, forming a polysilicon gate structure in said narrow hole opening in said first dielectric layer;

removal of a top portion of said first dielectric layer;

complete removal of said first dielectric layer, exposing all surfaces of said polysilicon gate structure;

ion implanting a second conductivity imparting dopant into an area of said semiconductor substrate, not covered by said polysilicon gate structure, to form a lightly doped source and drain region;

depositing a first insulator layer on said semiconductor substrate, and on said polysilicon gate structure;

anisotropic etching of said first insulator layer, to form an insulator spacer on the sides of said polysilicon gate structure;

ion implanting a third conductivity imparting dopant into an area of said semiconductor substrate, not covered by said polysilicon gate structure, and not covered by said insulator spacer, to form a heavily doped source and drain region;

depositing a second insulator layer on said semiconductor substrate, and on said polysilicon gate structure;

opening a contact hole in said second insulator layer, to expose top surface of said heavily doped source and drain region, and to expose top surface of said polysilicon gate structure;

depositing a metal layer on top surface of said second insulator layer, on top surface of said heavily doped source and drain region, and on top surface of said polysilicon gate structure, exposed in said contact hole; and patterning of said metal layer, to form metal contact structures to said heavily doped source and drain region, and to said polysilicon gate structure.

2. The method of claim 1, wherein said first dielectric layer is silicon oxide, deposited using LPCVD procedures, at a temperature between about 700° to 750° C., to a thickness between about 2000 to 5000 Angstroms.

3. The method of claim 1, wherein said narrow opening, in said photoresist layer, is between about 0.20 to 0.50 uM, in width.

4. The method of claim 1, wherein said polymer spacers are formed on the sides of said narrow opening, in said photoresist layer, to a thickness between about 0.10 to 0.20 uM, via use of a $CF_4$ and $CHF_3$ chemistry, in a plasma etch system, creating said polymer coated opening, in said photoresist layer, at a width between about 0.1 to 0.3 uM.

5. The method of claim 1, wherein said narrow hole opening in said first dielectric layer, is between about 0.1 to 0.3 uM, in width, formed via anisotropic RIE procedures, using $CHF_3$ as an etchant, using said polymer coated opening, in said photoresist layer, as a mask.

6. The method of claim 1, wherein said first conductivity imparting dopant, used to create said local threshold adjust region, in an area of said semiconductor substrate exposed in said narrow hole opening in said first dielectric layer, is boron, ion implanted at an energy between about 10 to 030 KeV, at a dose between about 1E11 to 1E13 atoms/cm$^2$.

7. The method of claim 1, wherein said gate insulator layer is silicon dioxide, thermally grown in an oxygensteam ambient, at a temperature between about 850° to 1000° C., to a thickness between about 50 to 200 Angstroms.

8. The method of claim 1, wherein said polysilicon layer, used to completely fill said narrow hole opening in said first dielectric layer, is deposited using LPCVD procedures, at a temperature between about 525° to 575° C., to a thickness between about 1000 to 2000 Angstroms.

9. The method of claim 1, wherein said polysilicon layer is removed from top surface of said first dielectric layer, via chemical mechanical polishing procedures, or via dry etching procedures, using $Cl_2$ as an etchant.

10. The method of claim 1, wherein said first dielectric layer is removed using a buffered hydrofluoric acid solution as an etchant.

11. A method of fabricating a deep, submicron MOSFET device, on a semiconductor substrate, with a local threshold voltage adjust region, self aligned to a polysilicon gate structure, comprising the steps of:

depositing a first silicon oxide dielectric layer on said semiconductor substrate layer;

forming a photoresist pattern, in a photoresist layer, on said first dielectric layer, with a deep submicron opening in said photoresist layer, exposing top surface of said first dielectric layer;

forming polymer spacers on the sides of said deep submicron opening, in said photoresist layer, creating a polymer coated opening, in said photoresist layer;

forming a deep submicron hole opening in said first dielectric layer, by etching of said first dielectric layer, exposed in said polymer coated opening, in said photoresist layer, as a mask;

removal of said photoresist pattern, and of said polymer spacers;

ion implanting a first conductivity imparting dopant into an area of said semiconductor substrate exposed in said deep submicron hole opening, in said first dielectric layer, to create said local threshold voltage adjust region;

growing a gate insulator layer on said semiconductor substrate, exposed in said deep submicron hole opening, in said first dielectric layer;

depositing a first polysilicon layer, completely filling said deep submicron hole opening in said first dielectric layer;

planarization of said first polysilicon layer, by removal of said first polysilicon layer from top surface of said first dielectric layer, to form said polysilicon gate structure, in said deep submicron hole opening in said first dielectric layer, and self aligned to said local threshold voltage adjust region;

removal of a top portion of said first dielectric layer;

complete removal of said first dielectric layer, exposing all surfaces of said polysilicon gate structure;

ion implanting a second conductivity imparting dopant into an area of said semiconductor substrate, not covered by said polysilicon gate structure, to form a lightly doped source and drain region;

depositing a first insulator layer on said semiconductor substrate, and on said polysilicon gate structure;

anisotropic etching of said first insulator layer to form an insulator spacer on the sides of said polysilicon gate structure;

ion implanting a third conductivity imparting dopant into an area of said semiconductor substrate, not covered by said polysilicon gate structure, and not covered by said insulator spacer, to form a heavily doped source and drain region;

depositing a second insulator layer on said semiconductor substrate, and on said polysilicon gate structure;

opening a contact hole in said second insulator layer, to expose top surface of said heavily doped source and drain regions, and to expose top surface of said polysilicon gate structure;

depositing a metal layer on the top surface of said second insulator layer, on the top surface of said heavily doped source and drain region, and on top surface of said polysilicon gate structure, exposed in said contact hole; and patterning of said metal layer to form metal contact structures to said heavily doped source and drain region, and to said polysilicon gate structure.

12. The method of claim 11, wherein said first dielectric layer is silicon oxide, deposited using LPCVD procedures, at a temperature between about 700° to 750° C., to a thickness between about 2000 to 5000 Angstroms.

13. The method of claim 11, wherein said deep submicron opening, in photoresist layer, is between about 0.20 to 0.50 uM in width.

14. The method of claim 11, wherein said polymer spacers are formed on the sides of said deep submicron opening, in said photoresist layer, to a thickness between about 0.10 to 0.20 uM, in a plasma etch system using a $CF_4$ and $CHF_3$ chemistry, creating said polymer coated opening, in said photoresist layer, of between about 0.10 to 0.30 uM.

15. The method of claim 11, wherein said deep submicron hole opening, in said first dielectric layer, is between about 0.10 to 0.30 uM, in width, formed anisotropic via RIE procedures using $CHF_3$ as an etchant, and using said polymer coated opening, in said photoresist layer, as a mask.

16. The method of claim 11, wherein said first conductivity imparting dopant, used to create local threshold voltage adjust region, in an area of said semiconductor substrate, exposed in said deep submicron hole opening in said first dielectric layer, is boron, ion implanted at an energy between about 10 to 30 KeV, at a dose between about 1E11 to 1E13 atoms/$cm^2$.

17. The method of claim 11, wherein said gate insulator layer is silicon dioxide, thermally grown in an oxygensteam ambient, at a temperature between about 850° to 1000° C., to a thickness between about 50 to 200 Angstroms.

18. The method of claim 11, wherein said polysilicon layer, used to completely fill said deep submicron hole opening, in said first dielectric layer, is deposited using LPCVD procedures, at a temperature between about 525° to 575° C., to a thickness between about 1000 to 2000 Angstroms.

19. The method of claim 11, wherein said polysilicon gate structure, self aligned to said local threshold voltage adjust region, is formed via removal of said polysilicon layer from top surface of said first dielectric layer, via either chemical mechanical polishing procedures, or dry etching procedure, using $Cl_2$ as an etchant.

20. The method of claim 11, wherein said first dielectric layer is removed using a buffered hydrofluoric acid solution.

* * * * *